(12) United States Patent
Ouchi et al.

(10) Patent No.: US 8,004,691 B2
(45) Date of Patent: Aug. 23, 2011

(54) MEASURING APPARATUS, EXPOSURE APPARATUS AND METHOD, AND DEVICE MANUFACTURING METHOD

(75) Inventors: Chidane Ouchi, Utsunomiya (JP); Akihiro Nakauchi, Utsunomiya (JP); Seima Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1076 days.

(21) Appl. No.: 11/721,397

(22) PCT Filed: Apr. 24, 2006

(86) PCT No.: PCT/JP2006/309063
§ 371 (c)(1),
(2), (4) Date: Jun. 11, 2007

(87) PCT Pub. No.: WO2006/115292
PCT Pub. Date: Nov. 2, 2006

(65) Prior Publication Data
US 2009/0290136 A1    Nov. 26, 2009

(30) Foreign Application Priority Data

Apr. 25, 2005  (JP) ................................. 2005-125977
Jan. 18, 2006  (JP) ................................. 2006-009879

(51) Int. Cl.
  *G01B 9/02*   (2006.01)
  *G02B 27/42*  (2006.01)
(52) U.S. Cl. ......................................... 356/521; 355/53
(58) Field of Classification Search .................. 356/511, 356/512, 515, 520, 521; 355/53, 67
See application file for complete search history.

(56) References Cited

U.S. PATENT DOCUMENTS 6,312,373 B1   11/2001  Ichihara
6,456,382 B2   9/2002   Ichihara et al.
(Continued)

FOREIGN PATENT DOCUMENTS

JP   2000-097666    4/2000
(Continued)

OTHER PUBLICATIONS

European Search Report dated Feb. 3, 2010, issued in a Communication dated Feb. 10, 2010, in counterpart European patent application No. 06 732 477.2.

(Continued)

*Primary Examiner* — Hung Henry Nguyen
*Assistant Examiner* — Steven H Whitesell-Gordon
(74) *Attorney, Agent, or Firm* — Fitzpatrick, Cella, Harper & Scinto

(57) ABSTRACT

A measuring apparatus includes a pinhole mask, located on an object plane of an optical system to be measured, and having a plurality of pinholes for generating a spherical wave from a measuring light beam, and a diffraction grating for splitting the measuring light beam that has passed the pinhole mask and the optical system, in which $Lg=m \cdot Pg^2/\lambda$ is met, where Pg is a grating pitch of the diffraction grating, $\lambda$ is a wavelength of the measuring light beam, m is an integer other than zero, and Lg is a distance between the diffraction grating and an image plane of the optical system. The measuring apparatus detects an interferogram formed by interference between a plurality of the measuring light beams split by the diffraction grating. The plurality of measuring light beams includes an aberration of the optical system.

12 Claims, 9 Drawing Sheets

U.S. PATENT DOCUMENTS

| | | | |
|---|---|---|---|
| 6,650,398 B2 | 11/2003 | Nakauchi et al. | 355/52 |
| 6,765,683 B2 | 7/2004 | Ichihara | |
| 6,867,846 B2 | 3/2005 | Poultney | |
| 6,977,728 B2 | 12/2005 | Nakauchi | 356/399 |
| 7,002,747 B2 | 2/2006 | Augustyn et al. | |
| 7,027,164 B2 | 4/2006 | Gontin et al. | |
| 7,164,534 B2 | 1/2007 | Augustyn et al. | |
| 7,253,907 B2 | 8/2007 | Ouchi | 356/520 |
| 7,283,252 B2 | 10/2007 | Kato | 356/515 |
| 2001/0028462 A1* | 10/2001 | Ichihara et al. | 356/512 |
| 2003/0215053 A1 | 11/2003 | Ichihara | |
| 2004/0114119 A1* | 6/2004 | Van Der Laan et al. | 355/67 |
| 2004/0169866 A1 | 9/2004 | Poultney | |
| 2005/0146700 A1 | 7/2005 | Poultney | |
| 2006/0256349 A1 | 11/2006 | Gontin et al. | |

FOREIGN PATENT DOCUMENTS

| | | |
|---|---|---|
| JP | 2003-086501 | 3/2003 |
| JP | 2003-254725 | 9/2003 |
| JP | 2004-219423 | 8/2004 |
| JP | 2006-196699 | 7/2006 |
| WO | 02/12826 A1 | 2/2002 |
| WO | WO 2006/115292 A1 | 11/2006 |

OTHER PUBLICATIONS

Aug. 8, 2006 Written Opinion and International Search Report in International Application No. PCT/JP2005/016877.

* cited by examiner

MEASURING APPARATUS, EXPOSURE APPARATUS AND METHOD, AND DEVICE MANUFACTURING METHOD

This application is a U.S. national stage application of PCT International Application No. PCT/JP2006/309063, filed Apr. 24, 2006, and which claims priority from Japanese patent application numbers 2005-125977, filed Apr. 25, 2005, and 2006-009879, filed Jan. 18, 2006, both of which are hereby incorporated by reference herein in their entirety as if fully set forth herein.

TECHNICAL FIELD

The present invention generally relates to a measuring apparatus, and more particularly, to a measuring apparatus that measures an aberration of an optical system to be measured ("tested optical system" hereafter), such as a projection optical system that projects a pattern of a reticle (mask) onto a plate to be exposed. The inventive measuring apparatus is suitable, for example, for measuring a wavefront aberration of a projection optical system in an exposure apparatus that employs, e.g., extreme ultraviolet ("EUV") light.

BACKGROUND ART

When photolithography is used to manufacture a semiconductor device, and the like, a projection exposure apparatus has, so far, been used to expose a pattern of a reticle onto a plate via a projection optical system. A growing demand for a finer semiconductor device promotes a reduction to practice of a projection exposure apparatus that uses EUV light having a wavelength (such as 5 nm to 20 nm) shorter than that of ultraviolet light.

For precise transfer of a mask pattern onto a plate with a desired magnification, a projection optical system requires a high imaging performance that maintains aberration to be as low as possible. Particularly, a growing demand for a finer semiconductor device causes the transfer performance to be sensitive to an aberration of the projection optical system. Therefore, a requirement is to measure a wavefront aberration of the projection optical system with high precision.

A lateral shearing interferometer ("LSI") is one known apparatus that highly, precisely, measures the wavefront aberration of a projection optical system for EUV light without extremely accurate alignment of a pinhole, unlike a point diffraction interferometer ("PDI"). In general, the LSI arranges a pinhole mask that has one pinhole on an object plate of the tested optical system. The image of the pinhole is projected on an image plane, while being influenced by aberration of the projection optical system. A diffraction grating is located between the image plane and the tested optical system, and the light beams transmitted through the tested optical system slightly laterally shift according to their diffraction order. As a result, the transmitted light beams slightly laterally shift on an observation plane subsequent to the image plane, and overlap and interfere with each other, generating an interferogram (interference pattern). The interferogram gives a laterally differential wavefront of the original wavefront, which is reconstructed to the original wavefront through integration.

To extract from the pinhole a light beam with enough intensity to measure a wavefront, it is necessary to use a bright light source and to condense the light from this light source to the pinhole. One conceivable bright light source is an undulator light source that is inserted into an electron storage ring, but this requires large-scale facilities, incurring a high cost. A small light source, particularly one which also serves as an exposure light source, is preferable for wavefront measurements used in an assembly process or at an installation place of an exposure apparatus.

On the other hand, a light beam from an exposure light source, such as laser produced plasma ("LPP") light and discharged produced plasma ("DPP") light, has such a low directivity that it is very difficult to condense the light to the pinhole. When this exposure light source is used for wavefront measurements, an amount of the light that passes the pinhole is too small to produce a sufficiently intense interference image on the observation plane for wavefront measurements.

One proposed scheme arranges many reflection dots on the object plane of the tested optical system to improve the light use efficiency. See, for example, Japanese Patent Application, Publication No. 2004-219423. This reference also discusses arranging a diffraction grating on an image plane position of the tested optical system. The diffraction grating laterally shifts diffracted light beams with different orders and causes interference. A phase shift method finds a differential wavefront between the laterally shifted diffracted light beams, and calculates the wavefront of the tested optical system.

In general, a lateral shearing interferometer (LSI) using the phase shift method needs to take multiple interference images while shifting, by a specific quantity, a phase difference between diffracted light beams with respective orders, and to similarly take multiple interference images while changing the above lateral shifting direction. Accordingly, this type of LSI should take two pairs of interference images, requiring a long period of time for measurements. A problem of measurement error occurs unless an optical component, such as a diffraction grating, is maintained extremely stable in its height direction when moved, while these interference images are being taken.

DISCLOSURE OF THE INVENTION

A measuring apparatus according to one aspect of the present invention includes a pinhole mask, located on an object plane of an optical system to be measured, and having a plurality of pinholes for generating a spherical wave from a measuring light, and a diffraction grating for splitting the measuring light that has passed the pinhole mask and the optical system, wherein $Lg = m \cdot Pg^2/\lambda$ is met, where Pg is a grating pitch of the diffraction grating, $\lambda$ is a wavelength of the measuring light, m is an integer other than zero, and Lg is a distance between the diffraction grating and an image plane of the optical system, and wherein the measuring apparatus calculates a wavefront aberration of the optical system from an interferogram formed by causing interference of the measuring light split by the diffraction grating.

An exposure apparatus according to another aspect of the present invention for exposing a pattern of a reticle onto a plate using light from a light source includes a projection optical system for projecting the pattern onto the plate, and the measuring apparatus using the light to detect a wavefront aberration of the projection optical system as an interferogram.

An exposure method according to still another aspect of the present invention includes the steps of calculating a wavefront aberration of a projection optical system as an optical system to be measured by using the measuring apparatus, adjusting the projection optical system based on a calculated wavefront aberration of the projection optical system, and exposing a plate by using an adjusted projection optical system.

A device manufacturing method, as still another aspect of the present invention, includes the steps of exposing a plate using the above exposure apparatus, and developing the plate that has been exposed. Claims for a device fabrication method for performing operations similar to those of the above exposure apparatus cover devices as intermediate and final products. Such devices include semiconductor chips, such as an LSI and VLSI, CCDs, LCDs, magnetic sensors, thin film magnetic heads, and the like.

A further object and other characteristics of the present invention will be made clear by the preferred embodiments described below by referring to the accompanying drawings.

BEST MODE FOR CARRYING OUT THE INVENTION

Referring to the accompanying drawings, a description will be given below according to the preferred embodiments of the present invention.

First Embodiment

Figure 1:
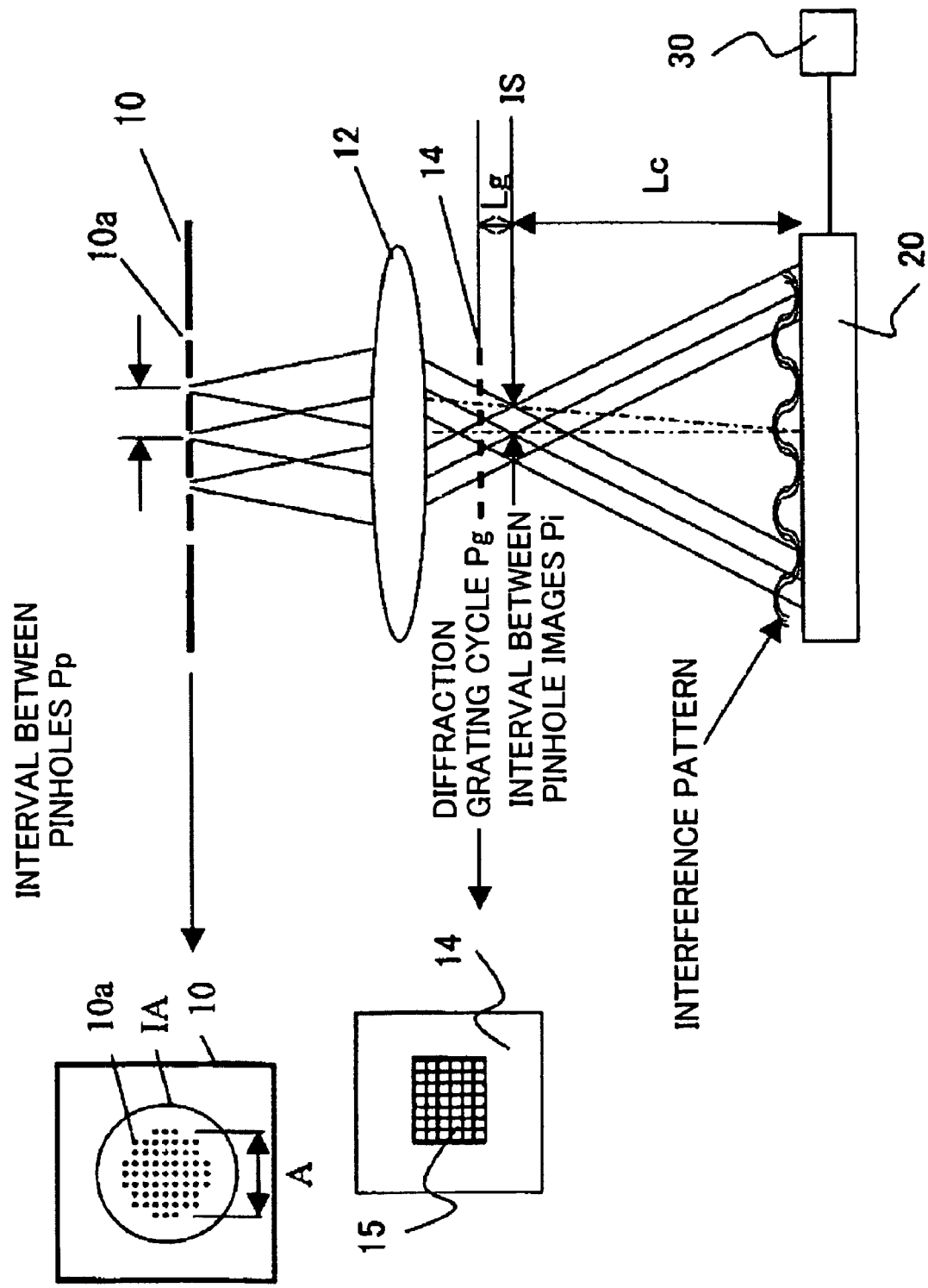
FIG. 1 is a schematic sectional view showing a structure of a measuring apparatus according to one aspect of the present invention.

FIG. 1 is a schematic sectional view showing a basic arrangement of a measuring apparatus according to one embodiment of the present invention, and schematic plan views of a pinhole mask 10 and a diffraction grating plate 14, when viewed from the top. The measuring apparatus 1 is one that measures an optical characteristic (a wavefront aberration in particular) of a tested optical system 12. The measuring apparatus 1 includes the pinhole mask 10, the diffraction grating plate 14, a detector 20, and a controller 30.

The pinhole mask 10 is located on an object plane of the tested optical system 12, and has plural pinholes 10a for generating spherical waves from the measuring light. The pinhole mask 10 should effectively shield the EUV light, and is made of Ni, for example. The pinhole mask 10 should be 150 nm thick or greater when Ni is used.

The pinhole 10a has a diameter equal to or less than the diffraction limit. For an EUV exposure optical system with a numerical aperture ("NA")=0.26 and a magnification=¼, the NA of its incidence side is 0.065, and a diameter of the pinhole 10a for covering diffraction angles in this range by an approximately aplanatic diffracted light is 13.5/(2×0.065) =104 nm. As described later, the pinhole 10a may be of a reflection type and of a transmission type. The plural pinholes 10a (or pinhole array) are arranged apart from each other by an interval of a spatial coherence length of an illumination light or longer.

The reflection pinhole mask 10 has, for example, a reflective film made of a multilayer film of molybdenum and silicon on a silicon or glass substrate, a chrome or another absorbing layer above it, and a hole in the absorbing layer penetrating through the reflection layer. The transmission pinhole mask 10 has a through hole in a self-supporting film made of, e.g., metal, such as nickel.

An interferogram generated by the light that has transmitted through or is reflected on the pinhole 10a, which is distant from a wavefront-aberration measuring point on a transfer area of the tested optical system 12, gradually changes shape according to a wavefront aberration characteristic of the tested optical system 12 as the distance increases. The area of the light transmitting or reflecting pinholes 10a should be limited to an area in which the aberration of the tested optical system 12 is regarded to be substantially the same. This embodiment sets an area size A of the pinhole array to an area having a diameter of 0.1 mm to 1 mm or so, in which the aberration of the tested optical system 12 is regarded to be the same. Even if the area size A of the pinhole array is made larger than the above area, a limited illumination area IA provides the same effect.

The diffraction grating plate 14 has a two-dimensional diffraction grating 15. The two-dimensional diffracting grating 15 is a diffraction grating that splits the light from the tested optical system 12 into many diffracted lights, and forms multiple light condensing points on an image plane IS. FIG. 1 omits diffracted lights other than the 0-th order generated by the two-dimensional diffraction grating 15. Equation 1 below provides a Talbot effect and a high contrast interferogram, where Lg is a distance Lg between the two-dimensional diffraction grating 15 and the image plane IS, Pg is a grating pitch of the diffraction grating, λ is a wavelength of the measuring light, and m is an integer other than zero. The condition "other than zero" is to generate a fine interferogram called a carrier in the interferogram, and to provide a wavefront reconstruction through a so-called Fourier transformation method, which Fourier-transforms an interferogram and obtains a wavefront from the phase information of the carrier component.

$$Lg = m \cdot Pg^2 / \lambda \quad (1)$$

The thus obtained interferogram is a maximum or a minimum (although it is maximum in FIG. 1), as understood from the symmetry of the light intensity at a point on the alternate long and short dash that connects a center of the aperture part of the diffraction grating 14 to the condensing point of the 0-th order diffracted light.

The detector 20 is a detector or a camera, such as a backside illumination type CCD, which serves as an observing means for observing an interferogram.

When the interval between plural pinholes is made longer than the spatial coherence length of the illumination light, lights passing the pinholes do not interfere with each other. On the detector 20, many interferograms generated from the lights from the pinholes 10a can be simply superimposed in terms of the intensity, and provide a sufficient light intensity on the detector 20 even if the illumination light intensity to respective pinholes 10a is low. When the bright and dark positions of the light intensity of the interferogram agree with each other, a sufficiently intense interferogram for measurements can be obtained without a contrast degradation of the interferogram.

Since the brightness and darkness of the interferogram agree on the line that connects the center of the aperture part of the diffraction grating plate 14 to the condensing point of the 0-th order diffracted light of the transmission light from each pinhole 10a, these straight lines cross each other at one point on the image plane of the detector 20 in order not to degrade the contrast. As is apparent from FIG. 1, Equation 2 below satisfies this condition, where Pg is the pitch of the grating, Pi is a cycle of a pinhole image, and Lc is a distance from the image plane IS of the tested optical system 12 to the detector 20:

$$Pi = Pg \cdot Lc/(Lg+Lc). \quad (2)$$

Equation 3 below is met, where Pp is a cycle of the pinhole array, and β is a magnification of the tested optical system 12:

$$Pp = Pi/\beta. \quad (3)$$

The cycle Pp that satisfies Equation 4 below provides accordance between the bright and dark positions of the light intensity of the interferogram resulting from the reflecting or transmitting light from any pinhole 10a on the detector 20 without a contrast degradation:

$$Pp = (Pg/\beta) \cdot (Lc/(Lg+Lc)). \quad (4)$$

While FIG. 1 arranges the two-dimensional diffraction grating 15 above the image plane IS, the diffracting grating 15 may be located below the image plane IS, although Lg becomes a negative value in this case.

When the detector 20 is sufficiently distant from the image plane IS, Equation 5 below may be made by approximating (Lg+Lc) to 1:

$$Pp = Pg/\beta. \quad (5)$$

The controller 30 acquires and analyzes an interferogram detected by the detector 20, and calculates a wavefront aberration of the tested optical system 12.

In operation, an illumination optical system (not shown) illuminates plural pinholes 10a in the pinhole mask 10 simultaneously, generating many spherical waves. The diffracted lights that have passed the pinholes 10a illuminate the tested optical system 12, are influenced by the aberration of the tested optical system 12, and form an image on the image plane IS via the diffraction grating plate 14. The detector 20 observes a sufficiently intense interferogram. This embodiment does not require observing two sets of interferograms, and avoids time-consuming measurements.

The controller 30 processes the thus obtained interferogram and reconstructs the wavefront of the tested optical system. One illustrative reconstruction method is a method that includes the steps of first obtaining differential wavefronts of the diffraction grating plate 14 in two orthogonal directions, then integrating these respective differential wavefronts in the two directions, and finally, synthesizing them.

Second Embodiment

Figure 10:
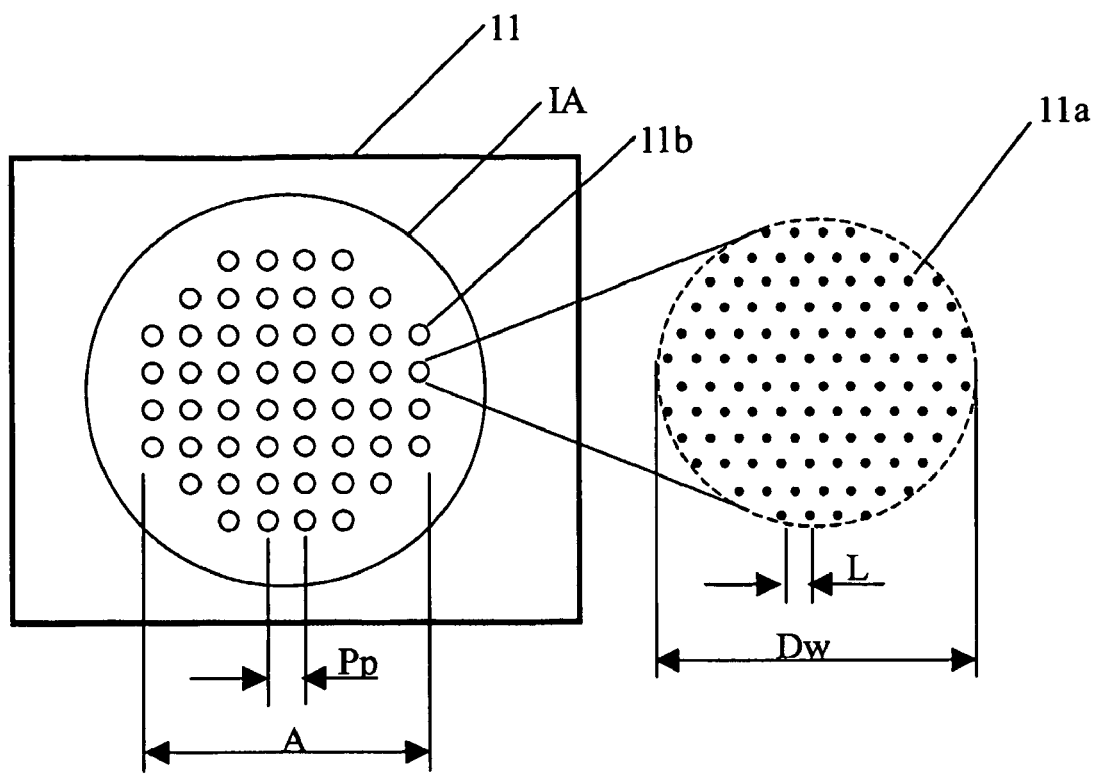
FIG. 10 is a schematic plan view showing a structure of a pinhole mask according to another embodiment of the measuring apparatus shown in FIG. 1.

FIG. 10 is a schematic plan view showing a structure of a pinhole mask 11 according to another embodiment of the measuring apparatus 1. The measuring apparatus 1 can replace the pinhole mask 10 with the pinhole mask 11. Similar to the pinhole mask 10, the pinhole mask 11 can be of a transmission type or of a reflection type. The location of the pinhole mask 11 in the measuring apparatus 1 is the same as that of the pinhole mask 10.

As shown in FIG. 10, the pinhole mask 11 has a pinhole unit 11b having pinholes 11a in each pinhole 10a of the pinhole mask 10. The pinhole mask 11 has many more pinholes 11a than the pinhole mask 10, improves its light use efficiency, and can measure the wavefront with a smaller amount of illumination light.

A smaller interval L between the pinholes 11a can increase the number of pinholes, and improve the light use efficiency. However, an excessively small interval L between the pinholes 11a causes interference between transmitting or reflected lights from adjacent pinholes, the deformed wavefront, and measurement errors. Restrained interference from adjacent pinholes and a smaller interval are preferable. For reduced interference between adjacent pinholes, the interval L of the pinhole 11a should be made such a distance that the coherence factor of the illumination light of the pinhole 11a becomes zero. The shortest interval for the coherence factor of zero is 0.61×λ/NAi, where NAi is the NA of the illumination light of the pinhole 11a, and its wavelength is λ.

Figure 11:
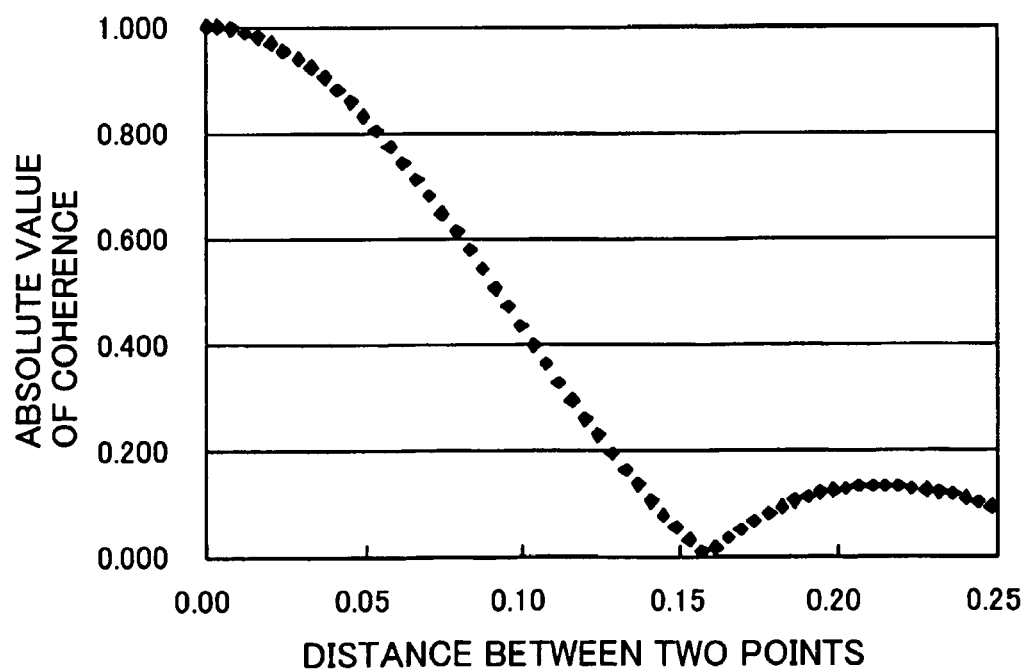
FIG. 11 is a graph showing a relationship between absolute values of coherence factors and a distance in two pinholes on the pinhole mask shown in FIG. 10 when NA=0.052 and λ=13.5 nm.

FIG. 11 is a graph showing a relationship between an absolute value of the coherence factor and a distance between two pinholes 11a in the pinhole mask 11. Referring to FIG. 11, a distance for the coherence factor of zero appears to be 0.16 μm. A regular triangle arrangement of the pinholes 11a, as shown in FIG. 10, maximize the number of the pinholes 11a, and thus, the light use efficiency.

Figure 12:
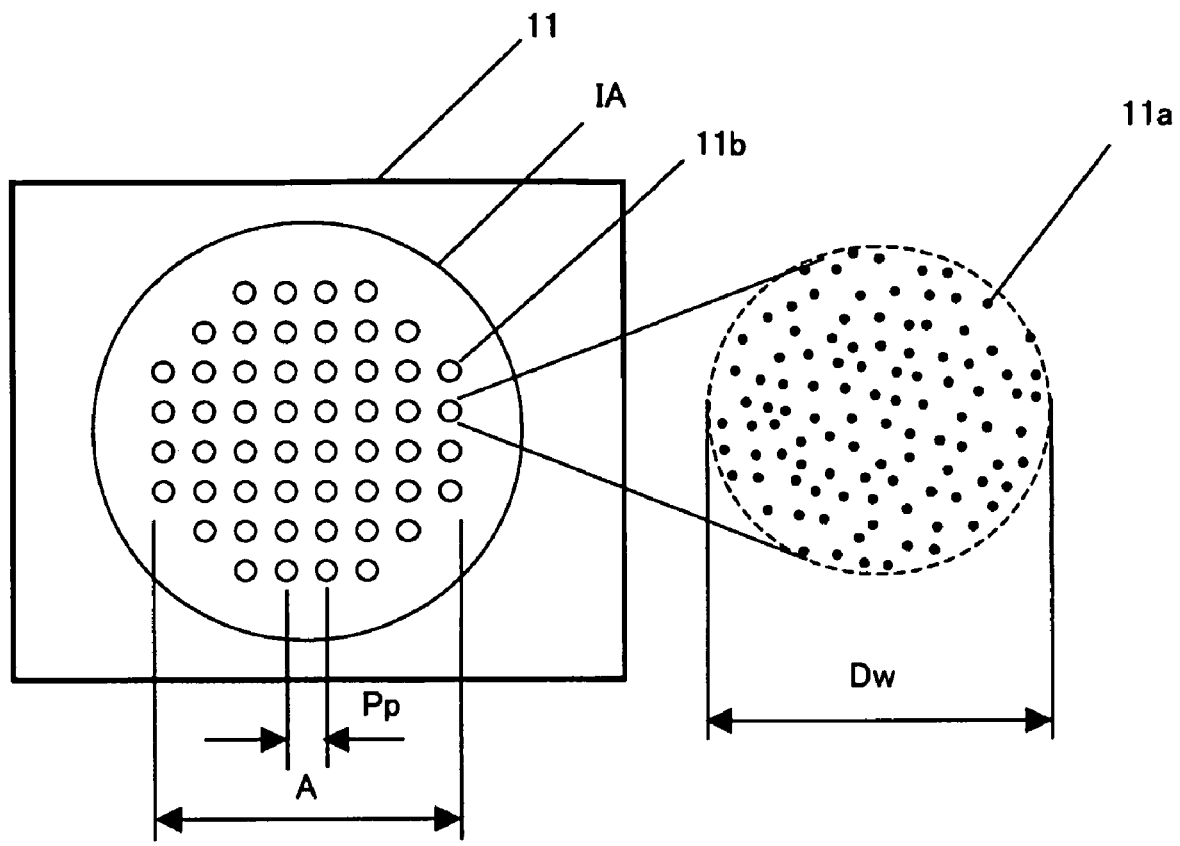
FIG. 12 is a plan view showing randomly arranged pinholes in the structure of the pinhole mask shown in FIG. 10.

FIG. 12 is a random arrangement illustration of the pinholes 11a. The regular arrangement shown in FIG. 10 enables the pinhole unit 11b to serve as a diffraction grating, and the illumination light to be discretely diffracted. As a result, when the incident-side NA of the tested optical system 12 is greater than the diffraction angle and the NA of the illumination light, the sufficiently intense incident light may not cover the entire incident pupil of the tested optical system 12. In that case, the randomly arranged pinholes 11a do not cause discrete diffractions of the illumination light, and the light incident upon the tested optical system 12 can cover the whole area of the incident pupil.

A larger diameter Dw of each pinhole unit 11b provides a wavefront measurement with a smaller amount of illumination light, but simultaneously deteriorates the contrast of an interferogram observed by the detector 20. Accordingly, the diameter Dw of the pinhole unit 11b should be determined by taking into account the intensity and contrast of the interferogram. One suitable example of a diameter Dw of the pinhole unit 11b is shown. The contrast of the interferogram will be deteriorated to 60% of the first embodiment where the interval Pp of a pinhole unit 11b is 3.5 μm, and the diameter Dw of the pinhole unit 11b is 0.6 times that of the interval Pp. On the other hand, the above interval of 0.16 μm of the pinhole 11a enables the pinhole unit 11b to include about one hundred sixty pinholes 11a, and provides an interference image that is about one hundred sixty times as intense as that of the first embodiment.

Third Embodiment

Figure 2:
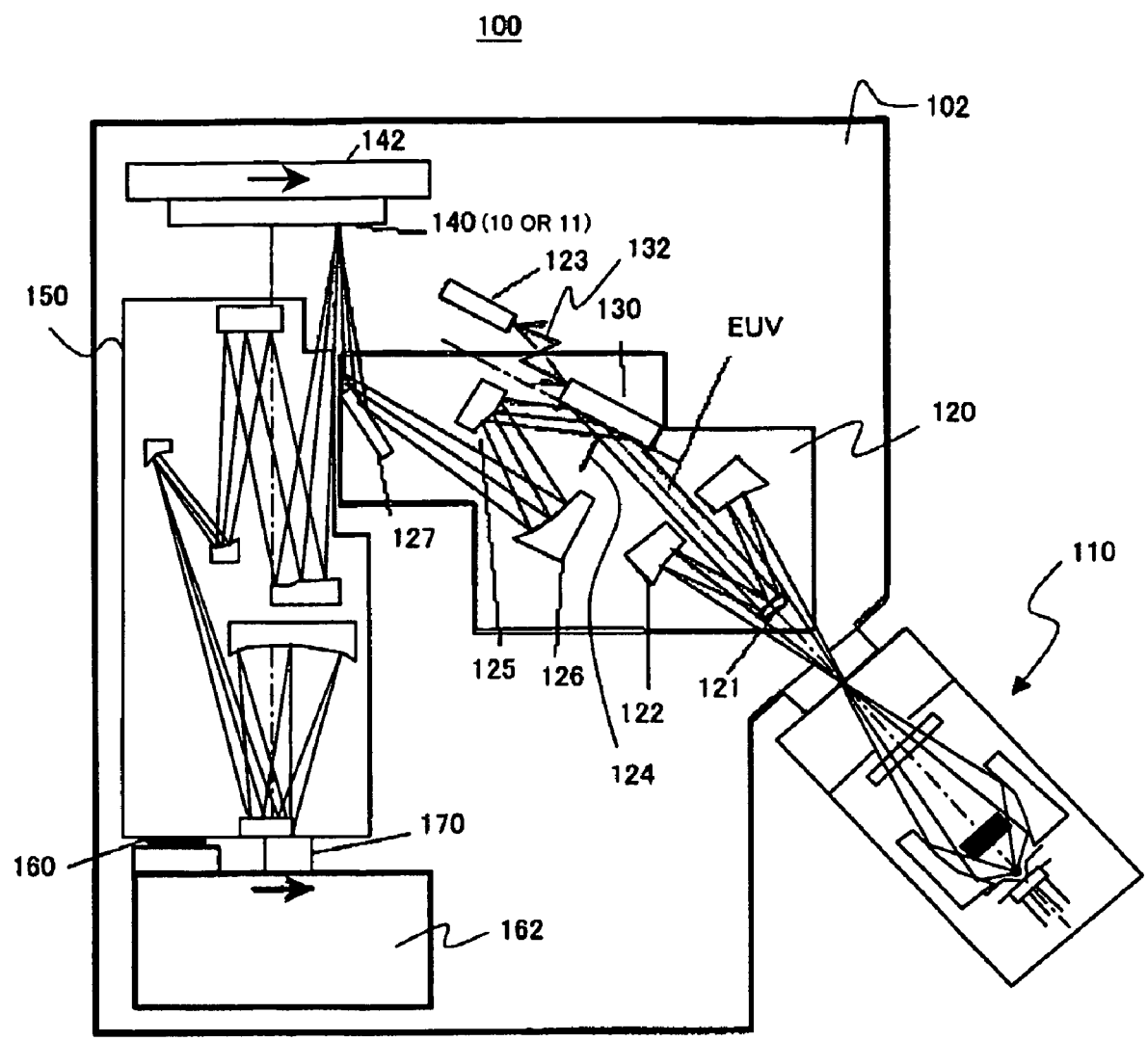
FIG. 2 is a schematic block diagram showing a structure of an exposure apparatus according to one aspect of the present invention.

Referring to FIG. 2, a description will be given below of an exposure apparatus 100 according to one aspect of the present invention. FIG. 2 is a schematic block diagram showing a configuration of the exposure apparatus 100. The exposure apparatus 100 uses the EUV light as exposure light. However, the present invention does not limit the exposure apparatus 100 to use the EUV light as the exposure light. The exposure apparatus 100 includes an EUV light source section 110, an illumination optical system 120, a mask stage 142 that supports and drives a mask 140, a projection optical system 150, a wafer stage 162 that supports and drives a wafer 160, and a wafer-side unit 170.

The exposure apparatus 100 is a projection exposure apparatus (scanner) that uses the EUV light (with a wavelength of, e.g., a step-and-scan method onto the wafer 160. Such an exposure apparatus is suitable for the photolithography process on a sub-micron or a quarter-micron order or less. Since the transmittance of the EUV light is low in the atmosphere, the illumination optical system 120, and the like, are housed in a vacuum chamber 102.

The EUV light source 110 is a light source that oscillates the EUV light, using a DPP EUV light source that generates EUV light by turning Xe gas, Sn steam, and the like, into plasma through discharge. The EUV light source 110 may use an LPP EUV light source that condenses and irradiates a high-output laser to Xe and Sn, to generate the plasma. The DPP light source ejects a gas around an electrode in a vacuum, applies a pulse voltage to the electrode, and causes discharge, thus generating the high-temperature plasma. The EUV light with a wavelength of 13.5 nm or so is emitted from the plasma and utilized. The target material may use a metallic thin-film, an inert gas, a liquid droplet, and the like. In order to enhance an average intensity of EUV light to be emitted, a higher repetitive frequency of the pulse laser is preferably, such as, typically, several kHz. The measuring apparatus 1 uses the exposure light source, and becomes smaller and less expensive than that using an undulator light source.

The illumination optical system 120 is an optical system that propagates EUV light to illuminate the mask 140. In this embodiment, the illumination optical system 120 has a collimator optical system, an integrator 123, an aperture stop 124, an arcing optical system, a planar mirror 127, a planar mirror 130, and a switching mechanism 132.

The collimator optical system serves to receive and substantially collimate the EUV light from the EUV light source 110, and includes a concave mirror 121, a convex mirror 122, and a plane mirror. The integrator 123 has multiple cylindrical reflective surfaces, a fly-eye, a fish-scale shaped fly-eye, and the like, thus uniformly illuminating the mask 140 with a predetermined NA. The integrator 123 is switched to the plane mirror 130 through the switching mechanism 132, and is located on the optical path during exposure. On the reflective surface of the integrator 123, the aperture stop 124 is located whose aperture surface is arranged almost perpendicular to the reflective surface. The aperture stop 124 regulates the distribution shape of the effective light source, and controls the angular distribution of light that illuminates each point on the mask 40 as an illuminated surface. The arcing optical system serves to condense light from the integrator 123 into an arcuate shape, and includes a convex mirror 125 and a concave mirror 126. The plane mirror 127 deflects the image-side light of the arcing optical system toward the mask 140 at a predetermined angle. This embodiment sets an incident angle of the plane mirror 127 to about 6° in measuring a wavefront of the projection optical system 150 as the tested optical system, which is equal to an angle between a corresponding principal light upon the object side of the projection optical system 150 and a normal of the mask plane.

The plane mirror 130 is switched to the integrator 123 and arranged on the optical path by the switching mechanism 132 during measurements of the wavefront of the projection optical system 150. The light that has reflected on the plane mirror 130 is reflected on the arcing optical system, and is condensed on the object plane of the projection optical system 130.

The mask 140 is a reflection type mask, on which a circuit pattern (or an image) to be transferred is formed, and is supported and driven by the mask stage 142. The diffracted light emitted from the mask 140 is reflected on the projection optical system 150, and is projected onto the wafer 160. The mask 140 and the wafer 160 are located in an optically conjugate relationship. Since the exposure apparatus 100 of this embodiment is a scanner, the mask 140 and the wafer 160 are scanned at the speed ratio of the reduction ratio, thus transferring the pattern on the mask 140 to the wafer 160.

In measuring the wavefront of the projection optical system 150, the pinhole mask 10 or 11 is located in place of the mask 140. The pinhole mask 10 or 11 is located on a dedicated stage for wavefront aberration measurement or the mask stage 142. This embodiment uses the pinhole mask 10 and the catoptric plural pinholes 10a. The light that has been reflected on the pinhole mask 10 passes the projection optical system 150, and forms an image on the image plane IS.

The projection optical system 150 serves to project the mask pattern onto the wafer 160, and is a tested optical system for the measuring apparatus 1. The projection optical system 150 is a coaxial optical system that includes multiple multilayer mirrors, and is designed to maintain a non-telecentric condition at its object side and a telecentric condition at its image side. The smaller number of multilayer mirrors in the projection optical system 150 increases the use efficiency of the EUV light, but the aberration correction becomes difficult. Four to six multilayer mirrors are necessary for aberration corrections. The multilayer mirror has a spherical or an aspheric reflective surface that is a convex surface or a concave surface. Their NAs range between 0.1 and 0.3.

The projection optical system 150 applied to the EUV light is quite sensitive to the positional accuracy and thermal deformation, and it is necessary that a wavefront aberration be measured during an exposure interval, and the mirror position be adjusted based on the measurement result for feedback. Impurities may adhere to the top of the multilayer mirror causing a chemical change, i.e., a so-called phase change, due to contamination that may arise. It is necessary to measure the wavefront aberration of the projection optical system 150 using an exposure wavelength on the exposure apparatus body, and the exposure apparatus 100, installed with measuring apparatus 1, meets this requirement.

The wafer 160 is a plate to be exposed, and covers a wide range of plates, such as a liquid crystal plate and other substrates. A photoresist is applied on the wafer 160.

The wafer stage 162 supports and drives the wafer 160. The wafer stage 162 may apply any structures known in the art, and thus, a detailed description of the structure and operations will be omitted.

Figure 3:
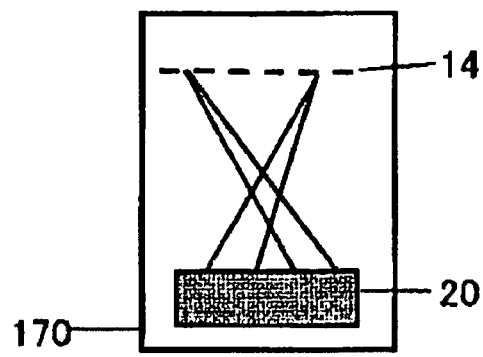
FIG. 3 is a schematic sectional view showing a structure of a wafer-side unit shown in FIG. 2.

The wafer-side unit 170 is provided on the image plane of the measuring apparatus 1. The wafer-side unit 170 is located on the wafer stage 162, and includes, as shown in FIG. 3, the diffraction grating plate 14 and the detector 20. Here, FIG. 3 is a schematic sectional view showing the wafer-side unit 170. The wafer-side unit 170 can be moved by the wafer stage 162 in a direction perpendicular to the optical axis. The light beams diffracted by the diffraction grating plate 14 generate an interferogram, while diffracted light beams with different orders on the detector 20 shift laterally and overlap each other. The interferogram can be analyzed by an LSI method to measure the wavefront aberration of the projection optical system 150.

In measuring the wavefront of the projection optical system 150, the switching mechanism 132 switches the integrator 123 to the plane mirror 130. This will enable the enlarged arc-shaped light on the object plane of the projection optical system 150 to be condensed as an image of the intermediate condensing point of the EUV light source 110. The pinhole mask 11 would also provide a similar effect.

The illumination optical system 120 illuminates the pinhole mask 10, and spherical wavefronts emitting from the plural pinholes 10a are diffracted in two orthogonal directions on the diffraction grating 14 via the projection optical system 150. These diffracted lights overlap each other while being laterally shifted, generating an interferogram on the detector 20. The controller 30 calculates differential wavefronts in two orthogonal directions from the interferogram obtained by the detector 20, and integrates them to reconstruct the original wavefronts. The method of obtaining the differential wavefront from the interferogram uses the Fourier transform method. The interferogram has information about differential wavefronts in two orthogonal directions, and the original wavefront can be reconstructed from one interference image.

The wafer stage 162 or other means moves the diffraction grating plate 14 to similarly measure aberrations at several points over the field of the projection optical system 150, and an aberration characteristic is measured over the field of the projection optical system 150. A light condensing spot is moved to an arbitrary object point with an arc field of the projection optical system 150 to measure a wavefront aberration. For this purpose, the plane mirror 130 is rotated around an axis that is parallel to the paper plane and plane mirror 130 (shown by a dotted line in FIG. 2), and the deflecting mirror 127 is rotated around an axis that is perpendicular to the paper plane. A rotation of the plane mirror 127 moves the light condensing spot in the lateral direction on the paper plane of FIG. 2. The reticle stage 142 and the wafer stage 162 move the pinhole 10a and the wafer-side unit 170 to the measurement positions in the transfer region.

The third embodiment switches the integrator 123 to the plane mirror 130, but an alternate embodiment uses multiple integrators and switches all the integrators to the plane mirrors, thus illuminating the pinhole masks 10 or 11 with high intensity.

Fourth Embodiment

Figure 4:
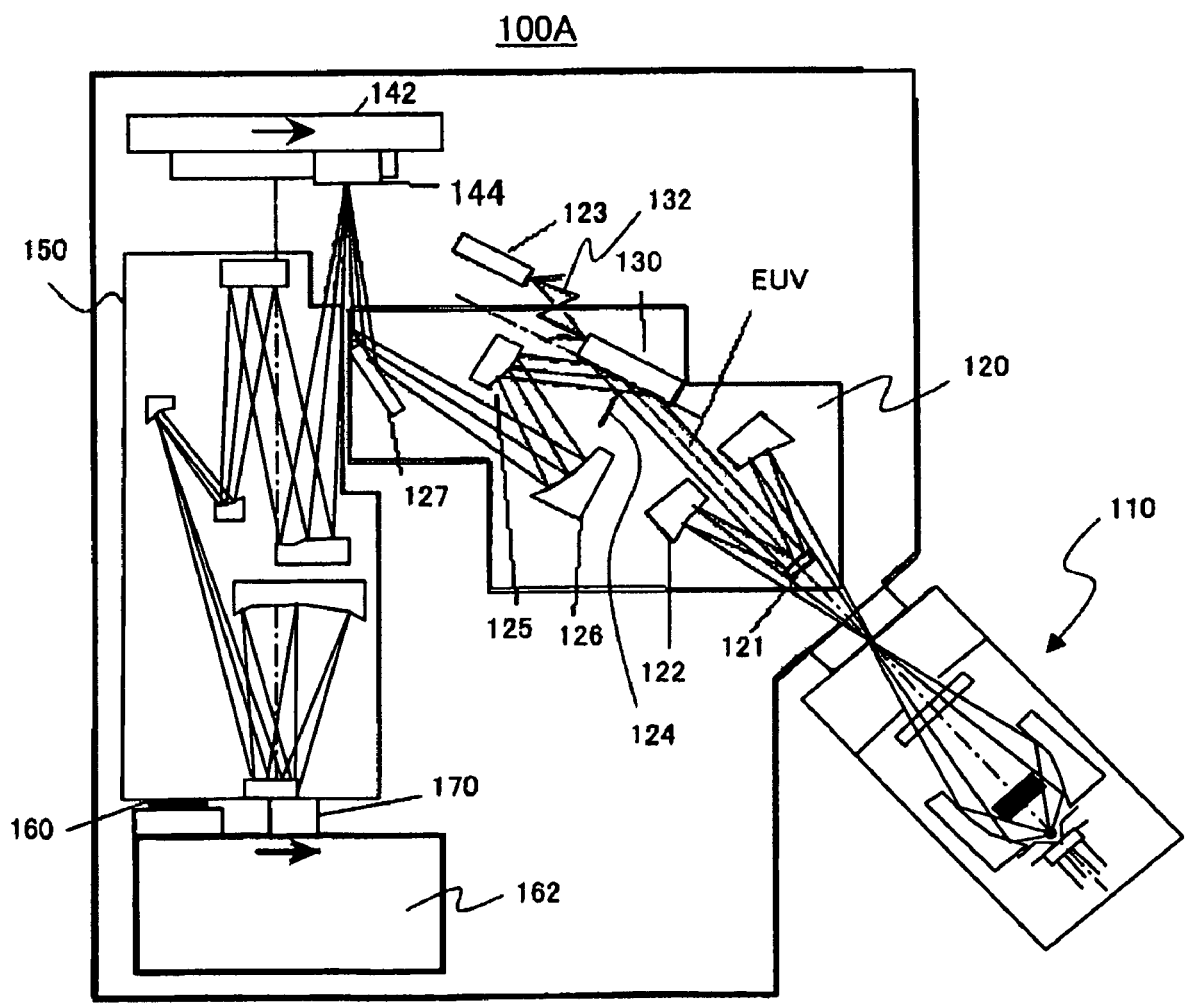
FIG. 4 is a schematic block diagram showing a structure of a variation of the exposure apparatus shown in FIG. 2.

Referring to FIG. 4, a description will be given of an exposure apparatus 100a. Here, FIG. 4 is a schematic block diagram showing the configuration of the exposure apparatus 100A. The exposure apparatus 100A is different from the exposure apparatus 100 in that the pinhole 10a of the pinhole mask 10 is changed to a transmission type pinhole to facilitate its manufacture. For a transmission type pinhole, the light beams need to be deflected from above the pinhole mask 10. The exposure apparatus 100A of this embodiment thus has a mask-side unit 144. The exposure apparatus 100a can have a similar effect even with the pinhole mask 11. Those elements in FIG. 4, which are the same as corresponding elements in FIG. 2, are designated by the same reference numerals, and a description thereof will be omitted.

Figure 5:
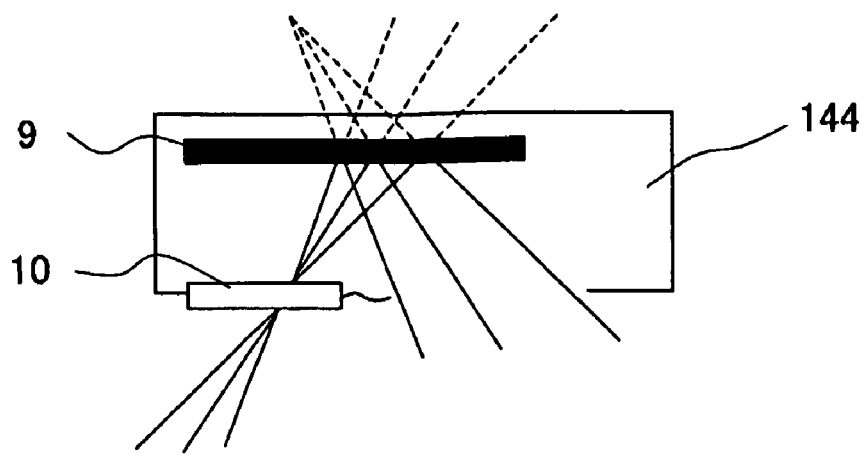
FIG. 5 is a schematic sectional view showing a structure of a mask-side unit shown in FIG. 4.

The mask-side unit 144 may be located on a dedicated test reticle or may be located on the mask stage 142. FIG. 5 is a schematic sectional view showing the structure of the mask-side unit 144. In FIG. 5, the light angle of the mask-side unit 144 is drawn as a large angle for description purposes. The mask-side unit 144 has the pinhole mask 10 having the pinholes 10a, and the deflecting mirror 9. The deflecting mirror 9 deflects the EUV light toward the pinhole mask 10.

Figure 6:
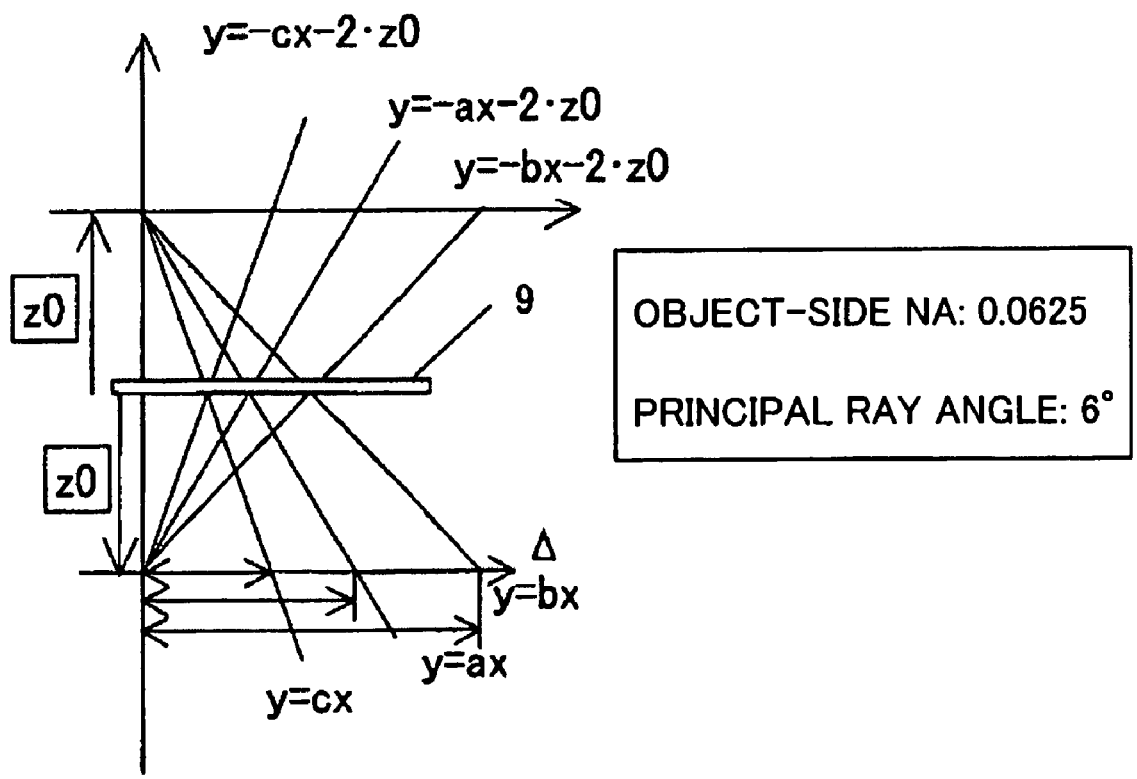
FIG. 6 is an optical path diagram showing a relationship between light entering the mask-side unit shown in FIG. 5 and reflective light.

Referring to FIG. 6, a description will be given of an interval of the deflecting mirror 9 and the pinhole mask 10, and of the light shielding. The object-side NA is 0.0625, the principal ray angle is 6°, and the interval between the deflecting mirror 9 and the pinhole mask 10 is z0. The principal ray is a straight line of y=ax (a=tan(90°-60°)), and the end lights are y=bx and y=cx, respectively.

Figure 7:
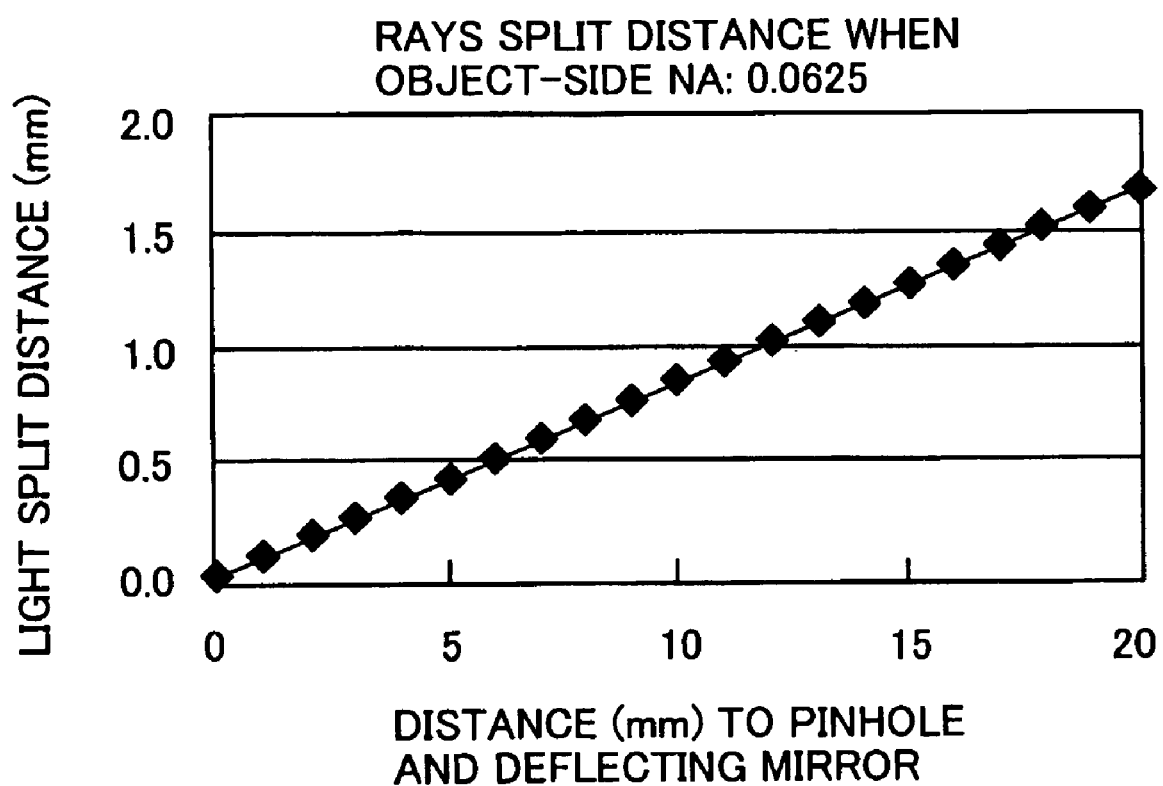
FIG. 7 is a graph showing a relationship between a split distance of illumination light and a distance between a pinhole mask and a deflecting mirror.

The EUV light from the illumination optical system 120 is reflected on the deflecting mirror 9 of the mask-side unit 144, and condensed on the pattern plane of the pinhole mask 10 where the transmission type pinhole 10a is located. The condensing point on the pattern plane of the pinhole mask 10 and the light from the illumination optical system 120 should be sufficiently separated. In other words, the straight line of y=cx and the condensing point must be spatially separated. A graph in FIG. 7 shows a relationship between the light separation distance Δ when the transmission type pinhole 10a is located at the distance z0 with respect to the reflection surface. Referring to FIG. 7, even if the image-side NA of the projection optical system 150 is 0.25 (the object-side NA is 0.0625), the light beams are separated by 1 mm or longer if the deflecting mirror 9 and the pinhole 10a are separated by 10 mm or so.

Fifth Embodiment

In the third embodiment, the distance from the arcing optical system to the object plane of the projection optical system 150 becomes longer by a deflection length of the deflecting mirror 9 in the mask-side unit 144 of FIG. 5. Thus, the light from the illumination optical system 120 forms an image of an intermediate condensing point before the pinhole mask 10, and lowers the light intensity on the pinhole mask 10. This embodiment solves this problem by using a convex mirror having a negative power instead of the plane mirror 130. This will extend the distance up to the condensing point, and even if the mask-side unit 144 uses the deflecting mirror 9, the light can be condensed into the pinhole mask 10.

Sixth Embodiment

A description will now be given of the exposure method of the present invention (aberration correction followed by exposure). In the exposure apparatus 100, multiple optical elements (not shown) composing the projection optical system 150 are installed to be movable in an optical axial direction and/or in a direction orthogonal to the optical axis. A driving system (not shown) for aberration adjustment drives one or more optical systems based on aberration information obtained by this embodiment to correct or to optimize one or more aberration values (especially, Seidel's five aberrations). The adjusting means of the aberration of the projection optical system 150 may use, in addition to movable lenses, various known techniques, such as a movable mirror (when the optical system is a catadioptric system and a catoptric system), a tilting plane-parallel plate, a pressure-controllable space, and an actuator-aided surface correction.

In exposure, the EUV light emitted from the EUV light source 110 arc-illuminates the reticle 140 uniformly. The EUV light is reflected on the reticle 140, carries a circuit pattern, and is imaged onto the wafer 160 via the projection optical system 150.

Seventh Embodiment

Figure 8:
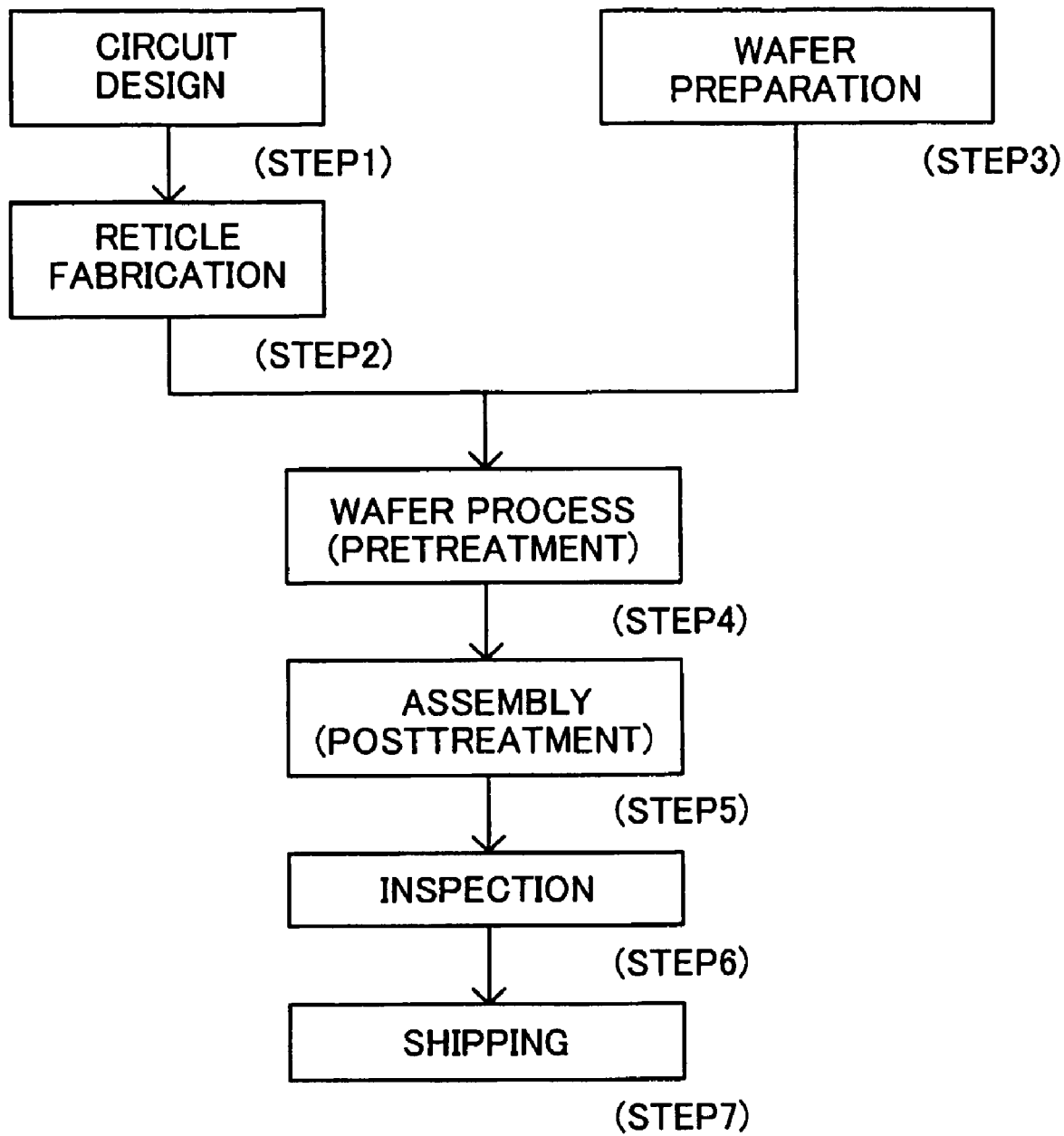
FIG. 8 is a flowchart for explaining fabrication of devices (e.g., semiconductor chips, such as ICs, LSIs, and the like, LCDs, CCDs, etc.).
Figure 9:
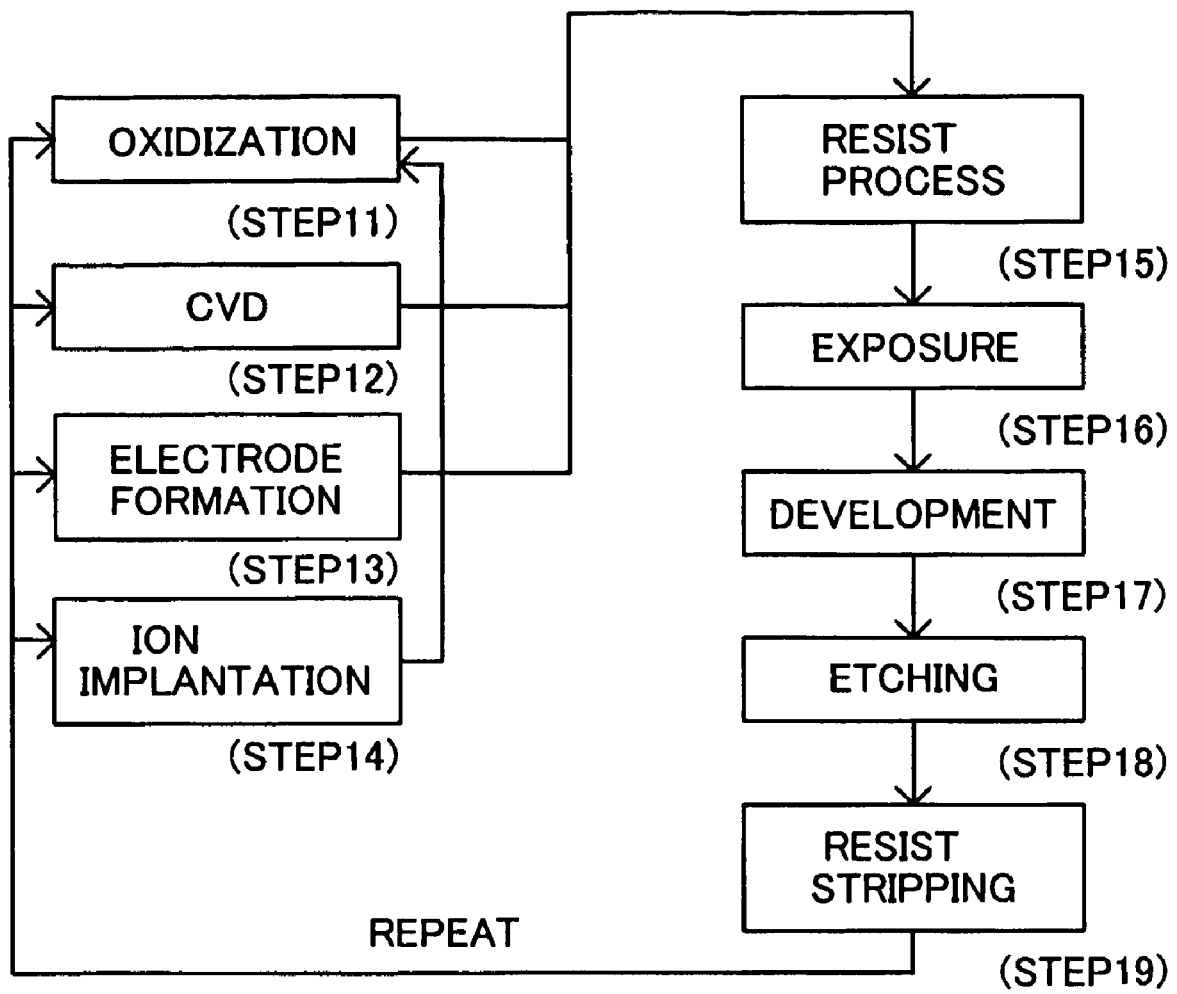
FIG. 9 is a flowchart for a wafer process shown in Step 4 shown in FIG. 8.

Referring now to FIGS. 8 and 9, a description will be given of an embodiment of a device manufacturing method using the above exposure apparatus. FIG. 9 is a flowchart for explaining a fabrication of devices (for example, semiconductor chips, such as ICs and LSIs, LCDs, CCDs, etc.). Here, a description will be given of fabrication of a semiconductor chip as an example. Step 1 (circuit design) designs a device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through a lithography technique using the mask and the wafer. Step 5 (assembly), which is also referred to as a post-treatment, forms into a semiconductor chip, the wafer formed in Step 4, and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process shown in Step 4 in FIG. 8. Step 11 (oxidation) oxidizes the surface of the wafer. Step 12 (CVD) forms an insulating film on the surface of the wafer. Step 13 (electrode formation) forms electrodes on the wafer by vapor disposition, and the like. Step 14 (ion implantation) implants ions into the wafer. Step 15 (resist process) applies a photosensitive material onto the wafer. Step 16 (exposure) uses the exposure apparatus to expose a circuit pattern of the mask onto the wafer. Step 17 (development) develops the exposed wafer. Step 18 (etching) etches parts other than a developed resist image. Step 19 (resist stripping) removes unused resist after etching. These steps are repeated, and multilayer circuit patterns are formed on the wafer. The manufacturing method of this embodiment uses a projection optical system adjusted based on highly precisely measured aberrations, which enables high-precision semiconductor devices to be manufactured, which have been so far difficult to accomplish. Further, the present invention is not limited to these preferred embodiments, and various variations and modifications may be made without departing from the scope of the present invention. For example, the present invention is also applicable to a step-and-repeat exposure apparatus.

The invention claimed is:

1. A measuring apparatus comprising:
   a pinhole mask, located on an object plane of an optical system to be measured, and having a plurality of pinholes for generating a spherical wave from a measuring light beam; and
   a diffraction grating for splitting the measuring light beam that has passed said pinhole mask and the optical system, wherein $Lg=m\cdot Pg^2/\lambda$ is met, where Pg is a grating pitch of the diffraction grating, $\lambda$ is a wavelength of the measuring light beam, m is an integer other than zero, and Lg is a distance between the diffraction grating and an image plane of the optical system, and
   wherein said measuring apparatus detects an interferogram formed by interference between a plurality of the measuring light beams split by said diffraction grating, the plurality of measuring light beams including an aberration of the optical system.

2. A measuring apparatus according to claim 1, wherein the plurality of pinholes are located two-dimensionally.

3. A measuring apparatus according to claim 1, wherein said pinhole mask is a reflection pinhole mask.

4. A measuring apparatus according to claim 1, wherein said pinhole mask is a transmission pinhole mask.

5. A measuring apparatus according to claim 1, wherein said diffraction grating is a two-dimensional diffraction grating.

6. A measuring apparatus according to claim 1, wherein $Pp=(Pg/\beta)\cdot(Lc/(Lg+Lc))$ is met, where Pp is an interval among the plurality of pinholes, Lc is a distance between the image plane of the optical system and an observing section for observing the interferogram, and $\beta$ is a magnification of the optical system.

7. A measuring apparatus according to claim 1, wherein $Pp=Pg/\beta$ is met, where $\beta$ is a magnification of the optical system, and Pp is an interval among the plurality of pinholes.

8. A measuring apparatus according to claim 1, wherein said pinhole mask comprises a plurality of pinhole units, each having a plurality of pinholes, and
   wherein $Pp=(Pg/\beta)\cdot(Lc/(Lg+Lc))$ or $Pp=Pg/\beta$ Pp is met, where Pp is an interval between central positions of the pinhole units, Lc is a distance between the image plane of the optical system and an observing section for observing the interferogram, and $\beta$ is a magnification of the optical system.

9. A measuring apparatus according to claim 8, wherein an interval of the pinholes in each pinhole unit sets a coherence factor of the light to zero.

10. An exposure apparatus for exposing a pattern of a reticle onto a plate using light from a light source, said exposure apparatus comprising:
    a projection optical system for projecting the pattern onto the plate;
    a measuring apparatus according to claim; and
    a controller configured to calculate a wavefront aberration of said projection optical system using a result of the interferogram detected by said measuring apparatus.

11. An exposure method comprising the steps of:
    calculating a wavefront aberration of the projection optical system using a result of the interferogram detected by the measuring apparatus according to claim 1;
    adjusting the projection optical system based on the calculated wavefront aberration of the projection optical system; and
    exposing a plate by using the projection optical system adjusted in said adjusting step.

12. A device manufacturing method comprising the steps of:
    (a) exposing a plate using an exposure apparatus; and
    (b) developing the plate exposed in said exposing step,
    wherein the exposure apparatus exposes a pattern of a reticle onto the plate using light from a light source, and includes:
    (i) a projection optical system for projecting the pattern onto the plate;
    (ii) a measuring apparatus according to claim 1; and
    (iii) a controller configured to calculate a wavefront aberration of the projection optical system using a result of the interferogram detected by the measuring apparatus.

* * * * *